United States Patent
Peng et al.

(10) Patent No.: US 11,177,146 B2
(45) Date of Patent: Nov. 16, 2021

(54) METHODS AND APPARATUS FOR PROCESSING A SUBSTRATE

(71) Applicant: APPLIED MATERIALS, INC., Santa Clara, CA (US)

(72) Inventors: Qi Jie Peng, Singapore (SG); Chin Wei Tan, Singapore (SG); Jun-Liang Su, Singapore (SG); Fang Jie Lim, Singapore (SG); Sriskantharajah Thirunavukarasu, Singapore (SG); Arvind Sundarrajan, Singapore (SG); Puay Han Tan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/670,138

(22) Filed: Oct. 31, 2019

(65) Prior Publication Data
US 2021/0134627 A1    May 6, 2021

(51) Int. Cl.
*H01L 21/62* (2006.01)
*H01L 21/67* (2006.01)
(Continued)

(52) U.S. Cl.
CPC .. *H01L 21/67248* (2013.01); *H01L 21/67098* (2013.01); *H01L 21/67288* (2013.01); *H01L 21/683* (2013.01); *H01L 22/30* (2013.01)

(58) Field of Classification Search
CPC ........... H01L 21/3247; H01L 21/67017; H01L 21/67109; H01L 21/67115;
(Continued)

(56) References Cited

U.S. PATENT DOCUMENTS 5,155,336 A * 10/1992 Gronet ................. C23C 16/481
   219/390
5,564,682 A   10/1996 Tsuji
(Continued)

FOREIGN PATENT DOCUMENTS

CN        1422791 A    6/2003
JP     2010118487 A    5/2010

OTHER PUBLICATIONS

International Search Report for PCT/US2020/043836, dated Nov. 10, 2020.

*Primary Examiner* — Mohammed Shamsuzzaman
(74) *Attorney, Agent, or Firm* — Moser Taboada

(57) ABSTRACT

Methods and apparatus for processing a substrate are provided herein. For example, a system for processing a substrate includes a process chamber comprising a first processing volume and a second processing volume; a first heating device configured to heat a substrate to a first temperature; a carrier configured to support the substrate while the substrate is being heated using the first heating device to the first temperature and transfer the substrate to and from each of the first processing volume and the second processing volume; a second heating device configured to maintain the substrate at or near the first temperature; and a chuck configured to receive the substrate from the carrier, and comprising an outer zone and an inner zone having independent variable pressure control to apply a chucking force at the outer zone that is different from a chucking force provided at the inner zone.

16 Claims, 5 Drawing Sheets

(51) Int. Cl.
*H01L 21/66* (2006.01)
*H01L 21/683* (2006.01)

(58) Field of Classification Search
CPC ......... H01L 21/67248; H01L 21/67288; H01L 21/6838; H01L 21/68742; H01L 21/68757; H01L 21/67428; H01L 21/67098; H01L 21/683; H01L 22/30
See application file for complete search history.

(56) References Cited

U.S. PATENT DOCUMENTS

| | | | |
|---|---|---|---|
| 6,433,352 B1 | 8/2002 | Oka | |
| 6,890,249 B1* | 5/2005 | Zuniga | B24B 37/32 451/177 |
| 6,975,960 B2 | 12/2005 | Kobayashi et al. | |
| 7,886,808 B2* | 2/2011 | Koguchi | H01L 21/67109 165/48.1 |
| 9,508,563 B2 | 11/2016 | Kwon et al. | |
| 10,319,606 B1 | 6/2019 | Gandhi et al. | |
| 2006/0289432 A1 | 12/2006 | Morita et al. | |
| 2007/0128570 A1 | 6/2007 | Goto et al. | |
| 2008/0171131 A1* | 7/2008 | Moro | H01L 21/6875 427/8 |
| 2012/0088203 A1 | 4/2012 | Mizunaga et al. | |
| 2013/0183831 A1* | 7/2013 | Yu | H01L 21/67115 438/758 |
| 2013/0280838 A1* | 10/2013 | Shin | H01L 29/66742 438/34 |
| 2014/0318680 A1* | 10/2014 | Wada | B32B 37/10 156/60 |
| 2014/0329341 A1* | 11/2014 | Furutani | H01L 21/67109 438/14 |
| 2015/0380267 A1* | 12/2015 | Han | H01J 37/3244 438/694 |
| 2016/0131352 A1* | 5/2016 | Thirunavukarasu | H05K 1/112 362/249.02 |
| 2016/0322234 A1* | 11/2016 | Lew | F27B 9/02 |
| 2017/0038202 A1 | 2/2017 | Saito | |
| 2019/0035650 A1* | 1/2019 | Nakai | H01L 21/67051 |
| 2020/0357674 A1* | 11/2020 | Moriya | H01L 21/68707 |

* cited by examiner

METHODS AND APPARATUS FOR PROCESSING A SUBSTRATE

FIELD

Embodiments of the present disclosure generally relate to methods and apparatus for processing a substrate, and more particularly, to methods and apparatus for correction of warped substrates.

BACKGROUND

In today's semiconductor backend packaging applications, substrates can include multiple die inside the same semiconductor package, e.g., in applications where high performance and low power are critical. For example, high performance and/or low power are, typically, required for communication between one or more integrated circuit (IC) chips disposed on substrates—which can be established using either a silicon or an organic interposer, e.g., a chip or layer with through-silicon vias (TSV) for communication, which are common on 2.5D substrates.

Unfortunately, high warpage of such substrates, which can sometimes occur due to the extreme temperature changes that are present as the substrate is, being processed, renders the substrates unsuitable (or useless) for further processing, e.g., downstream processes. Additionally, as the IC chips can sometimes be exposed on the substrates, e.g., when the substrate is not epoxy mold encapsulated, physical contact to correct the warpage of substrates is not a viable option.

Accordingly, the inventors have provided methods and apparatus that use contactless warpage correction.

SUMMARY

Methods and apparatus for processing a substrate are provided herein. In some embodiments, apparatus can include a system for processing a substrate. The system, for example, includes a process chamber comprising a first processing volume and a second processing volume; a first heating device disposed within the first processing volume and configured to heat a substrate to a first temperature; a carrier configured to support the substrate while the substrate is being heated using the first heating device to the first temperature and transfer the substrate to and from each of the first processing volume and the second processing volume; a second heating device disposed within the second processing volume and configured to maintain the substrate at or near the first temperature; and a chuck disposed within the second processing volume and configured to receive the substrate from the carrier, wherein the chuck comprises an outer zone and an inner zone having independent variable pressure control such that while the substrate is being cooled on the chuck, the chuck is configured to apply a chucking force at the outer zone that is different from a chucking force provided at the inner zone.

In accordance with at least some embodiments of the present disclosure, a method for processing a substrate includes heating the substrate to a first temperature while supported on a carrier disposed within a first processing volume of a process chamber using a first heating device disposed within the first processing volume; transferring the substrate from the first processing volume to a second processing volume of the process chamber; maintaining the substrate at or near the first temperature using a second heating device disposed within the second processing volume; transferring the substrate to a chuck located in the second processing volume; and cooling the substrate on the chuck while providing a chucking force at an outer zone of the chuck that is different than a chucking force provided at an inner zone of the chuck.

In accordance with at least some embodiments of the present disclosure, a nontransitory computer readable storage medium having stored thereon instructions, that when executed by a processor configure the processor to perform a method for processing a substrate that includes heating the substrate to a first temperature while supported on a carrier disposed within a first processing volume of a process chamber using a first heating device disposed within the first processing volume; transferring the substrate from the first processing volume to a second processing volume of the process chamber; maintaining the substrate at or near the first temperature using a second heating device disposed within the second processing volume; transferring the substrate to a chuck located in the second processing volume; and cooling the substrate on the chuck while providing a chucking force at an outer zone of the chuck that is different than a chucking force provided at an inner zone of the chuck.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
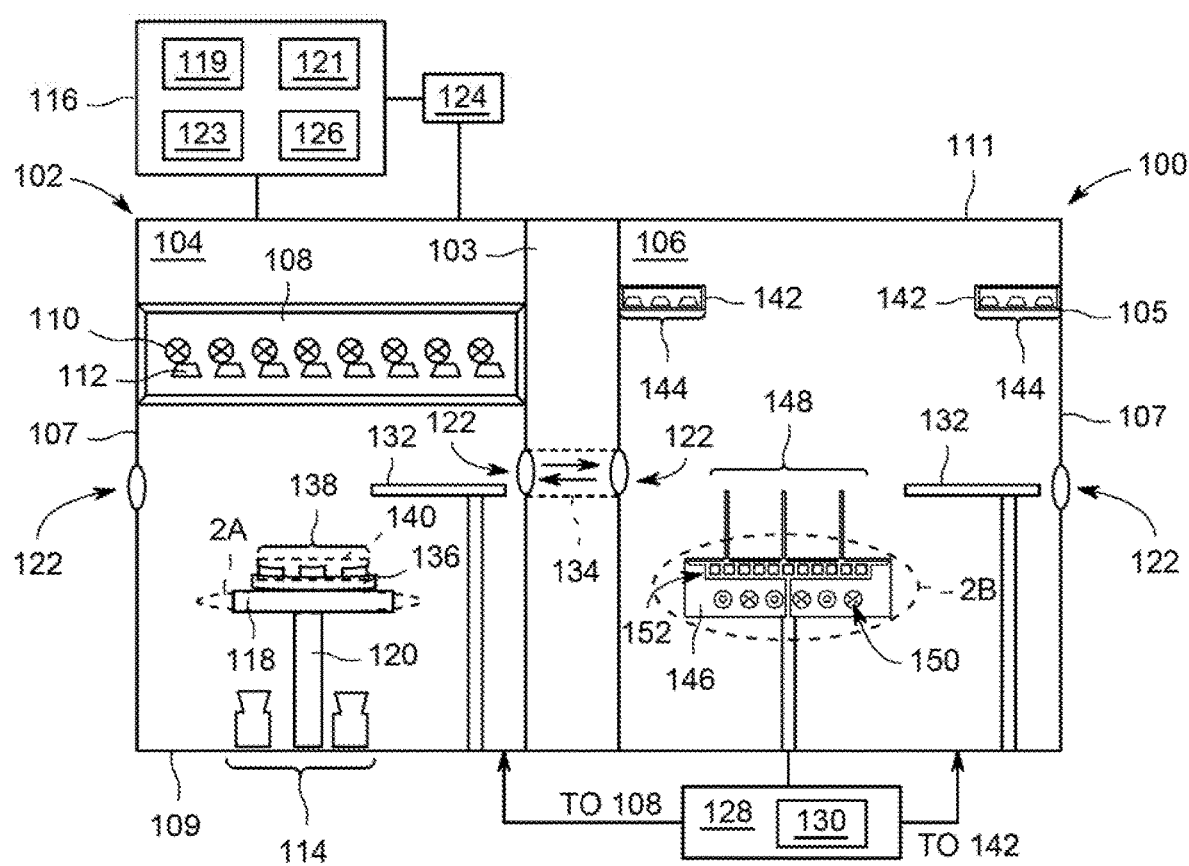
FIG. 1 is a schematic diagram of a system used for processing a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus are provided herein. For example, apparatus can be embodied in a system comprising a process chamber including two processing volumes configured for contactless warpage correction of one or more substrates. More particularly, a first processing volume can be configured to receive one or more substrates (e.g., substrates in need of warpage correction) on a carrier configured to support a substrate while the substrate is being heated. During heating of the substrate, the carrier allows for thermal expansion of the substrate, thus allowing the substrate to fully expand to correct warpage of the substrate. After the thermal expansion of the substrate, the substrate can be transferred to a dual zonal chuck disposed in the second processing volume. The dual zonal chuck includes inner and outer zones having individual variable pressure control. The outer zone can be maintained at a higher pressure than the inner zone while the substrate is being rapidly cooled. The combination of high pressure at the outer zone and rapid cooling maintains the substrate in the thermally expanded state (e.g., unwarped or substantially flattened state). Accordingly, the system described herein provides a quick, inexpensive, and contactless method for warpage correction of a substrate.

FIG. 1 is a schematic diagram of a system 100 used for processing a substrate in accordance with at least some embodiments of the present disclosure The system 100 can be embodied in one or more apparatus. For example, in the illustrated embodiment, the system 100 is shown comprising a process chamber 102 that includes a chamber body 105 defined by sidewalls 107, a bottom surface 109, and a top surface 111. The chamber body 105 encloses two processing volumes, a first processing volume 104 and a second processing volume 106 (e.g., made from one or more metals, such as aluminum, steel, etc.) in which one or more types of substrates can be received for processing. In at least some embodiments, when a substrate is being processed within the first processing volume 104 and the second processing volume 106, the chamber body 105 can be configured to provide a vacuum environment, e.g., to eliminate/reduce thermal cooling dynamics while the substrate is being heated, cooled, transferred between the first processing volume 104 and the second processing volume 106. etc. In at least some embodiments, the system 100 can include two individual stand-alone processing chambers each including respective processing volumes. Alternatively, the system 100 can include two or more process chambers that are part of a common tool or platform, such as a cluster tool.

In some embodiments, the process chamber 102 can be configured for various substrate packaging applications, e.g., 2.5D substrate backend packaging. In such embodiments, the first processing volume 104 of the process chamber 102 can include a first heating device 108 that is configured to heat a substrate to a first temperature. The first heating device 108 can include, for example, one or more of heaters, gas delivery devices, etc. For example, in at least some embodiments, the first heating device 108 can include one or more of a heater 110 and a gas delivery device 112. In at least some embodiments, the heater 110 can be a lamp, coil, or the like and can be configured to provide radiative heating, resistive heating, etc. For example, in at least some embodiments, the heater 110 can be an infrared heating lamp. The heater 110 can be used to facilitate heating a substrate (and/or one or more process gases) to the first temperature Additionally, the gas delivery device 112 can be any gas delivery device suitable for providing one or more heated process gases into the first processing volume, including, but not limited to, a gas delivery shower head, gas delivery ring, and the like. For example, in at least some embodiments, the gas delivery device 112 can be a gas delivery showerhead configured to provide one or more heated gases, e.g., nitrogen, argon, helium, neon, krypton, radon, or other inert gas, etc. into the first processing volume 104 for heating a substrate to the first temperature. For example, in at least some embodiments, the gas delivery device 112 can be configured to provide hot nitrogen gas into the first processing volume 104 for heating the substrate to the first temperature, as will be described in greater detail below.

The first processing volume 104 can include one or more temperature sensors 114 (temperature sensors 114) that are configured to monitor a temperature of the substrate and/or a carrier configured to support the substrate while the substrate is being heated to the first temperature. The temperature sensors 114 can include, but are not limited to, thermopile sensors, non-contact sensor, such as, infrared sensors, and the like. For example, in at least some embodiments, the temperature sensors 114 can include one or more infrared temperature sensors (two infrared sensors shown in FIG. 1). The temperature sensors 114 are operatively coupled to a controller 116 of the process chamber 102 for monitoring a temperature of the substrate (and/or the carrier), while the substrate is being heated, e.g., in-situ. The temperature sensors 114 can be positioned in different locations within the first processing volume 104 e.g., the sidewalls 107 on the first heating device 108 or adjacent thereto, on the bottom surface 109, etc. In at least some embodiments, such as the illustrated embodiment, the temperature sensors 114 are located on the bottom surface 109 adjacent a carrier in the first processing volume.

The first processing volume 104 can include a carrier 118 that is configured to support a substrate while the substrate is being heated to the first temperature. The carrier 118 can be made from suitable material, which is capable of supporting a substrate and being heated to one or more temperatures, including, but not limited to, metal, glass, ceramic, etc. For example, the carrier 118 can be made from metal including, but not limited to, steel, aluminum, copper, etc. For example, in at least some embodiments, the carrier 118 can be made from aluminum.

Additionally, the carrier 118 can have one or more geometric configuration, e.g., circular, rectangular, oval, etc. For example, and with reference to FIG. 2A, in at least some embodiments, a carrier 200a, which can be used as the carrier 118, can have a generally circular configuration. The inventors have found that the circular configuration provides suitable thermal surface area contact for a substrate, which, in turn, can reduce heat loss from a bottom side or surface of a substrate. The carrier 200a includes a substrate support surface 202a that is configured to support a substrate and configured to allow the substrate to fully expand while the substrate is being heated to the first temperature. The carrier 200a includes an outer flange (or lip) 204a that is configured to maintain the substrate in a relatively fixed configuration (e.g., while the substrate is being heated to the first temperature and/or while the substrate is being transferred to and from the first processing volume 104 and the second processing volume 106.

Figure 2A:
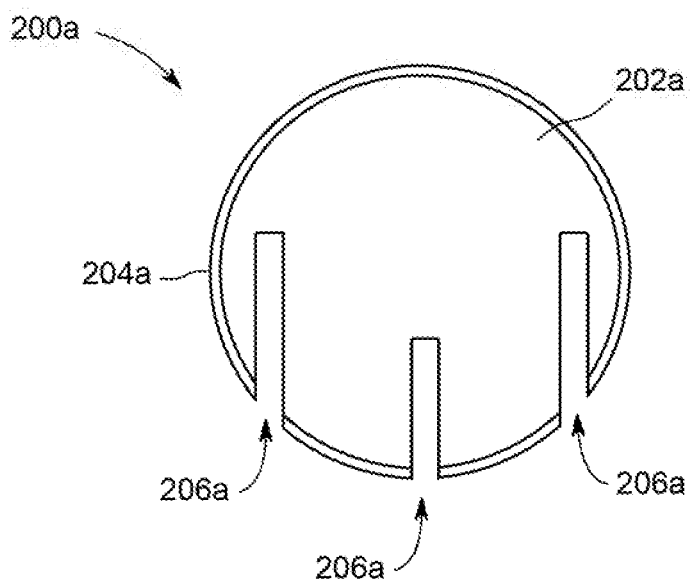
FIG. 2A is a top view of the indicated area of detail 2A of FIG. 1 in accordance with at least some embodiments of the present disclosure.

Disposed through the substrate support surface 202a can be one or more exposed slots, or apertures 206a that extend parallel to each other. For illustrative purposes, three exposed slots 206a are shown in FIG. 2A. The exposed slots 206a are configured to receive corresponding pins of a chuck disposed in the second processing volume 106 while the carrier 200a is being positioned over the chuck for transfer of the substrate onto the pins, as will be described in greater detail below.

With reference again to FIG. 1, in at least some embodiments, a lift assembly 120 (e.g., including one or more of a motor, an actuator, indexer, or the like) is disposed within the first processing volume 104 and is configured to control a vertical position of the carrier 118. The vertical position of the carrier 118 is controlled to facilitate transfer of the substrate through openings 122 (e.g., a slit valve opening) disposed along various locations of the process chamber, e.g., for loading/unloading a substrate into/out of the process chamber 102, transferring the substrate between the first processing volume 104 and the second processing volume 106, etc. For example, the openings 122 can be formed through both of the sidewalls 107 and an inner wall 103, which separates the first processing volume 104 and the second processing volume 106, at a height proximate the carrier 118. In some embodiments, the opening 122 may be retractably sealable, for example, to control the pressure and temperature conditions of the first processing volume 104 and the second processing volume 106, The controller 116 is provided and coupled to various components of the process chamber 102 to control the operation of the process chamber 102 for processing a substrate. The controller 116 includes a central processing unit (CPU) 119, support circuits 121 and a memory or non-transitory computer readable storage medium 123. The controller 116 is operably coupled to and controls one or more energy sources 124 directly, or via computers (or controllers) associated with a particular process chamber and/or support system components. Additionally, the controller 116 is configured to receive an input from, for example, the temperature sensor for controlling, the one or more energy sources 124 such that a temperature of the substrate does not exceed a threshold while the substrate is being processed.

The controller 116 may be any form of general-purpose computer processor that can be used in an industrial setting for controlling various chambers and sub-processors. The memory, or non-transitory computer readable storage medium, 122 of the controller 116 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 121 are coupled to the CPU 119 for supporting the CPU 119 in a conventional manner. The support circuits 121 include cache, power supplies, clock circuits, input/output circuitry and subsystems, and the like. Inventive methods as described herein, such as the method for processing a substrate (e.g., noncontact warpage correction), may be stored in the memory 122 as software routine 126 that may be executed or invoked to control the operation of the one or more energy sources 124 in the manner described herein. The software routine may also be stored and/or executed by a second CPU (not shown) that is remotely located from the hardware being controlled by the CPU 119.

The one or more energy sources 124 can supply power to the process chamber 102 and the components thereof using either or both of DC power and RF power. The one or more energy sources 124 can be used to power, for example, the controller 116, the first heating device 108 including the heater 110 and the gas delivery device 112, the lift assembly 120, the temperature sensors 114, one or more robots of the process chamber 102, and the components disposed in the second processing volume 106, as will be described in greater detail below.

A gas supply 128 is coupled to the process chamber 102 and is configured to provide one or more heated process gases suitable for heating a substrate via, for example, the gas delivery device 112, into the first processing volume 104 and the second processing volume 106. As noted above, the process gas can be, for example, nitrogen, argon, helium, neon, krypton, radon, or other inert gas, etc. The gas supply 128 is configured to supply heated process gas into the first processing volume 104 and the second processing volume 106 to heat a substrate to a first temperature. in at least some embodiments, the gas supply 128 can include a heating device (not shown) that can heat a process gas to a sufficient temperature. Alternatively or additionally, the heater 110 can be configured to heat the process prior to the process gas being injected into the first processing volume 104 via the gas delivery device 112. For example, in at least some embodiments, the gas supply 128 can provide heated process gas, e.g., nitrogen, to the gas delivery device 112 of the first heating device 108 to heat a warped substrate (and/or the carrier 118) to a glass transition temperature ($T_g$) of the substrate (and/or an epoxy on a substrate, if provided). Heating the substrate to the glass transition temperature $T_g$ of the substrate and allowing the substrate to freely expand on the carrier 118 flattens or straightens the substrate to an unwarped or substantially flattened configuration. In at least some embodiments, the carrier 118 and a substrate can be heated to thermal equilibrium. As can be appreciated, heating a substrate (and/or the carrier 118) to the glass transition temperature $T_g$ of the substrate (and/or an epoxy on a substrate, if provided) and/or to thermal equilibrium can depend on one more factors including, but not limited to, a type of material that a substrate, epoxy, and/or a carrier is made from, etc. The inventors have found, for example, that the glass transition temperature $T_g$ for most substrates presently used is at a temperature of about 150° C. to about 200° C. However, the actual glass transition temperature $T_g$ of any given substrate will depend upon the composition of the substrate and may be greater or less than the above temperature range.

A vacuum source 130 (or pump) can be coupled to the gas supply 128 and an exhaust port (not shown) in the chamber body 105 of the processing chamber 102 to control a pressure during processing and/or exhaust hot gas from the first processing volume 104 and the second processing volume 106, as will be described in greater detail below. In at least some embodiments, the vacuum source 130 can be configured to provide suction to a chuck disposed in the second processing volume 106, as will be described in greater detail below.

One or more robots are disposed within the first processing volume 104 and/or the second processing volume 106. For example, in at least some embodiments, a robot 132 can be disposed within each of the first processing volume 104 and the second processing volume 106. The robots 132 can be any robot suitable for transferring a substrate into and out of the first processing volume 104 and the second processing volume 106, and for transferring a substrate between the first processing volume 104 and the second processing volume 106. For example, in at least some embodiments, the robots 132 can be configured to receive a substrate, e.g., from a load lock (not shown) coupled to the process chamber 102, and position the substrate onto and off of the carrier 118 and a chuck disposed within the second processing volume 106. The robots 132 are also configured to transfer a substrate from the first processing volume 104 to the second processing volume 106 (and vice versa) via, for example, a pathway 134 (shown in phantom in FIG. 1) defined through the inner wall 103, For example, in at least some embodiments, the robot 132 in the first processing volume 104 can transfer the carrier 118 including a substrate which have been previously processed, e.g., heated to the glass transition temperature $T_g$ of the substrate (and/or an epoxy on a substrate, if provided) and/or thermal equilibrium between a substrate and carrier, through the pathway 134 and handoff the carrier 118 including the substrate to the robot 132 of the second processing volume 106. The robot 132 of the second processing volume 106 can, subsequently, transfer the substrate to a chuck disposed within the second processing volume 106, as will be described in greater detail below.

A substrate 136 can be made from one or more materials, including, but not limited to, silicon, germanium, etc. For example, in at least some embodiments, the substrate 136 can be made from silicon, e.g., a through-silicon via (TSV) interposer substrate assembly, Additionally, one or more solder bumps (not explicitly shown) can be disposed on the substrate 136 and configured to support one or more corresponding IC chips 138. An epoxy mold 140 can be used to fully or partially encapsulate the substrate 136. For example, in at least some embodiments, the epoxy mold 140 can be used to encapsulate only the one or more solder bumps on the substrate 136, e.g., epoxy mold underfill. Additionally, in at least some embodiments, the epoxy mold 140 can be used to encapsulate both the one or more solder bumps and the ICs chips 138, as illustrated in FIG. 1.

Continuing with reference to FIG. 1, the second processing volume 106 can be substantially identical to the first processing volume 104. For example, the second processing volume 106 can include one or more heating devices. More particularly, the second processing volume 106 can include a second heating device 142 that is configured to maintain the substrate 136 at the first temperature during transfer of the substrate 136 from the first processing volume 104 to the second processing volume 106. For example, in at least some embodiments, the second heating device 142 can include a gas delivery device 144. The gas delivery device 144 can be any gas delivery device including, but not limited to, a gas delivery shower head, gas delivery ring, and the like. For example, in at least some embodiments, the gas delivery device 144 can be a gas delivery ring that is disposed above a chuck 146. For example, in at least some embodiments, the gas delivery device 144 can be disposed above the chuck 146 and can extend radially outward from the chuck 146. The gas delivery device 144 is configured to provide one or more hot gases, e.g., nitrogen, to maintain the substrate 136 at the first temperature, e.g., to the glass transition temperature $T_g$ of the substrate (and/or an epoxy on a substrate, if provided) and/or to thermal equilibrium between a substrate and carrier, prior to cooling the substrate 136, as will be described in greater detail below. Alternatively or additionally, as described above with respect to the first heating device 108, in at least some embodiments, the second heating device 142 can further include a heater (e.g., a lamp, coil, or the like) configured to provide radiative heating, resistive heating, etc. For example, in at least some embodiments, the heater can be an infrared heating lamp configured to heat a substrate and/or a process gas.

The chuck 146 can include one or more pins (or supports) 148 that are configured to allow the carrier 118 including the substrate 136 to be positioned above the chuck 146 when the chuck 146 is in the first position. As noted above, the pins 148 correspond to the plurality of exposed slots of the carrier 118 (e.g., the exposed slots 206a of the carrier 200a of FIG. 2A). Accordingly, for illustrative purposes, three pins 148 are shown in FIG. 1. Additionally, in at least some embodiments, rows of pins can be provided. For example, instead of having only one pin corresponding to an exposed region of a carrier, two or more pins in a row of pins can correspond to each exposed slots, e.g., for additional support or stability.

Additionally, the chuck 146 is movable from a first position for receiving the substrate 136 from the carrier 118 to a second position for cooling the substrate 136. More particularly, when the substrate 136 is being transferred from the carrier 118 to the chuck 146, the chuck 146 is in the first position. In the first position, the chuck 146 is in a lowered configuration and the pins 148 are exposed (e.g., uncovered from the chuck 146, see FIG. 1, for example). The robot 132 under the control of the controller 116 positions the carrier 118 so that the exposed slots of the carrier 118 align with the pins 148. Once aligned, the robot 132 moves the carrier 118 above the chuck 146 so that the carrier 118 can be lowered and the substrate 136 positioned on the pins 148. With the substrate 136 positioned on the pins 148, and the carrier 118 no longer positioned above the chuck 146, the chuck 146 can be moved to the second position. In the second position the chuck 146 is in a raised configuration and the pins 148 are no longer exposed (e.g., covered by the chuck 146) and the substrate 136 is supported by a top surface of the chuck 146, as will described in greater detail below).

A plurality of internal cooling channels 150 can be provided on the chuck 146 and are configured to provide one or more suitable cooling fluids to rapidly cool the substrate 136 when the substrate 136 is positioned on the chuck 146, e.g., with the chuck in the raised configuration. The cooling fluid can be, for example, chilled water or other suitable heat transfer fluid (e.g., dielectric fluid, such as, GALDEN®, or the like). For example, in at least some embodiments, the cooling fluid used to rapidly cool the substrate 136 can be chilled water.

Additionally, a plurality of conduits or channels 152 or other suitable device cable of providing suction from the vacuum source 130 are defined within the chuck 146 and are configured to provide suction to a top surface of the chuck 146 during operation, as will be described in greater detail below.

Figure 2B:
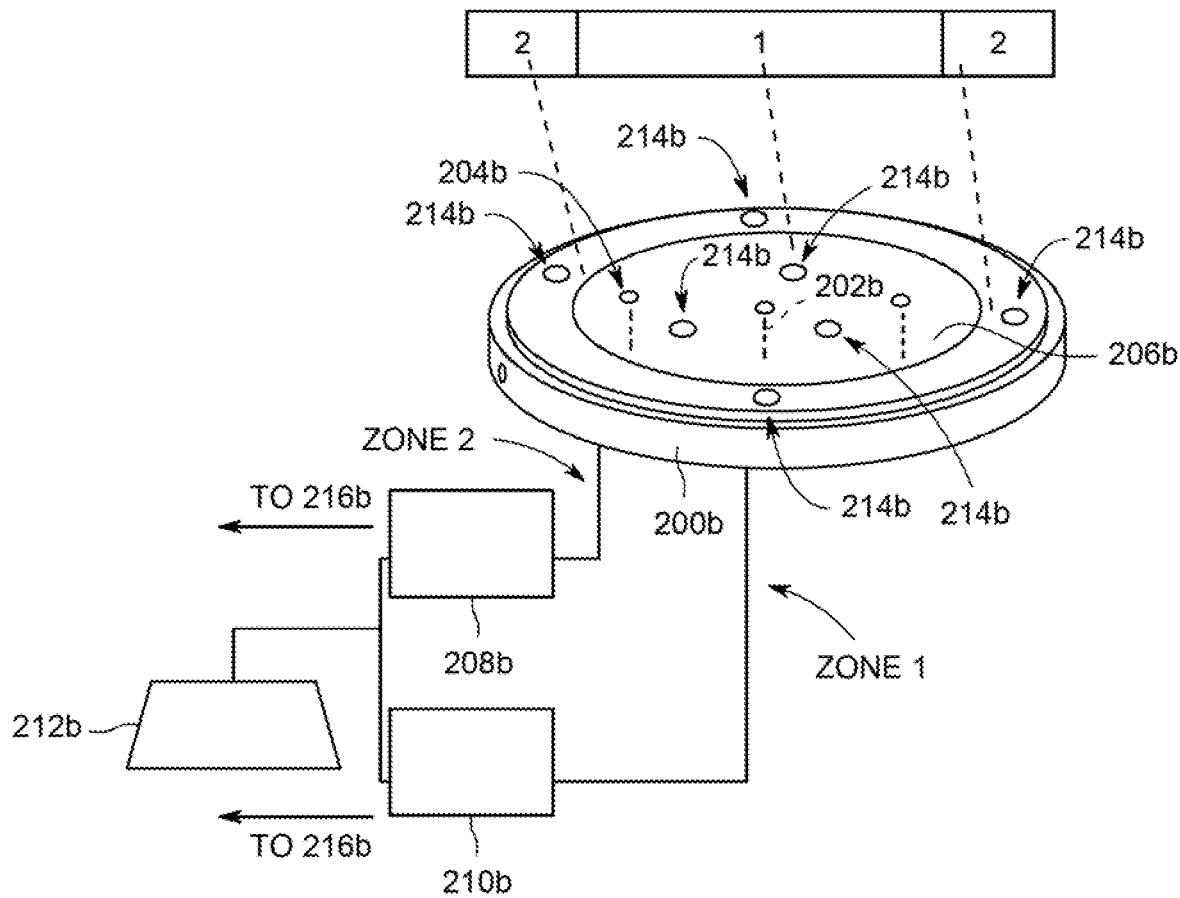
FIG. 2B is a top perspective view of the indicated area of detail 2B of FIG. 1 in accordance with at least some embodiments of the present disclosure.

FIG. 2B is a perspective view of the indicated area of detail 28 of FIG. 1 in accordance with at least some embodiments of the present disclosure. More particularly, FIG. 2B illustrates a chuck 200b that can be used for the chuck 146. For illustrative purposes, pins 202b (shown in phantom) are shown covered by the chuck 200b (e.g., the chuck 200b is in the first position). Corresponding apertures 204b are defined through a substrate support surface 206b of the chuck 200b and are configured to allow the pins 202b to move from the exposed configuration to unexposed configuration as the chuck 200b is being moved vertically from the first position and the second position, respectively.

The chuck 200b includes an outer zone 2 and an inner zone 1 each having plurality of apertures 214b. For illustrative purposes, four apertures 214b are shown disposed within the outer zone 2 and three apertures 214b are shown disposed within the inner zone 1. However, in at least some embodiments, more or fewer apertures 214b can be disposed within each of the outer zone 2 and inner zone 1.

Additionally, the outer zone 2 and inner zone 1 are coupled to a vacuum source 212b (e.g., the vacuum source 130) having individual corresponding variable pressure controls 208b, 210b, e.g., controlled by a controller 216b, which can be used for the controller 116. The pressure provided by the vacuum source 212b is configured to provide a suction (or chucking) force to the outer zone 2 and the inner zone 1 so that a warped portion of the heated substrate 136, which can be disposed over the outer zone 2 and inner zone 1, can be pulled toward the substrate support surface 206b of the chuck 200b. Suction can be provided to the heated substrate 136 until the heated substrate 136 is no longer warped, e.g., a bottom surface of the heated substrate 136 contacts or substantially contacts the substrate support surface 206b of the chuck 200b, e.g, the heated substrate 136 is flat or substantially flat, as in the unwarped configuration.

For example, depending on the type of warpage, e.g., concave or convex, the controller 216b controls the variable pressure controls 208b and 210b to vary a pressure (e.g., suction or chucking force) at the outer zone 2 and inner zone 1, so that a chucking force provided at the outer zone 2 is different from a chucking force provided at the inner zone. For example, in at least some embodiments, e.g., when the warpage is concave, the controller 216b can control the variable pressure controls 208b, 210b of the vacuum source 212b so that a pressure at the outer zone 2 is greater than a pressure at the inner zone 1. Conversely, in at least some embodiments, e.g., when the warpage is convex, the controller 216b can control the variable pressure controls 208b, 210b of the vacuum source 212b so that a pressure at the outer zone 2 is less than a pressure at the inner zone 1.

Once the substrate 136 is in the unwarped configuration, the cooling fluid can be provided to internal cooling channels, e.g., internal cooling channels 150, on the chuck 200b to rapidly cool the substrate 136 so that the substrate 136 remains fixed in the unwarped configuration.

Figure 3:
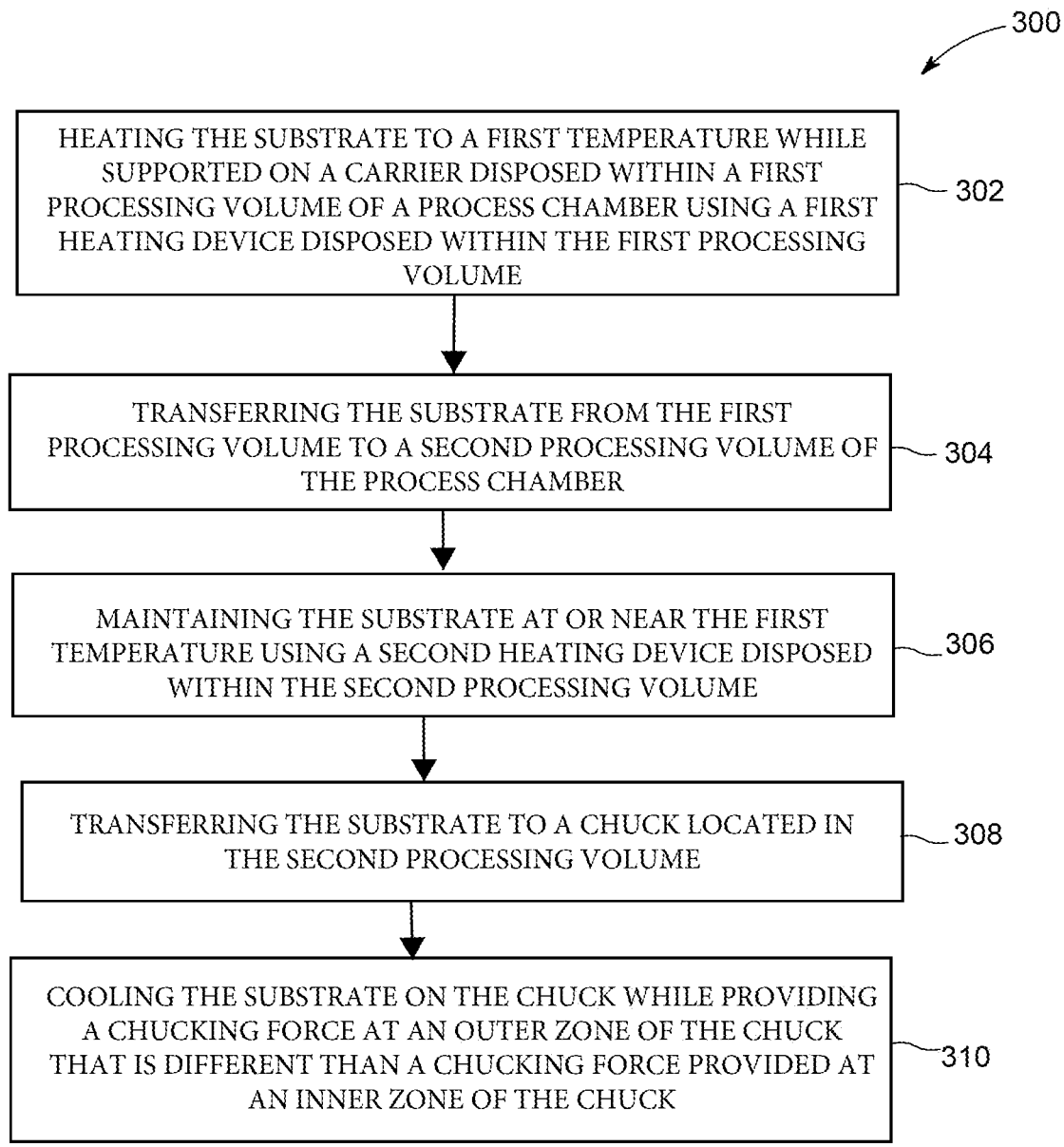
FIG. 3 is a flowchart of a method for processing a substrate in accordance with at least some embodiments of the present disclosure.
Figure 4A:
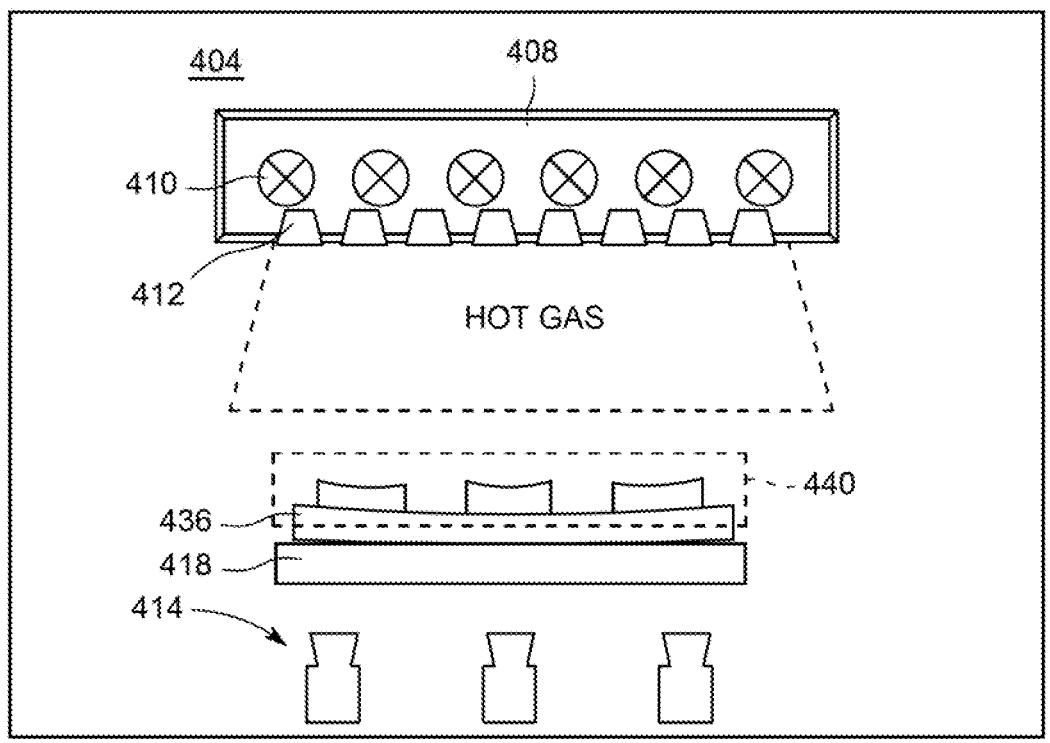
FIGS. 4A-4D are sequence diagrams illustrating a substrate being processed using the method of FIG. 3.
Figure 4B:
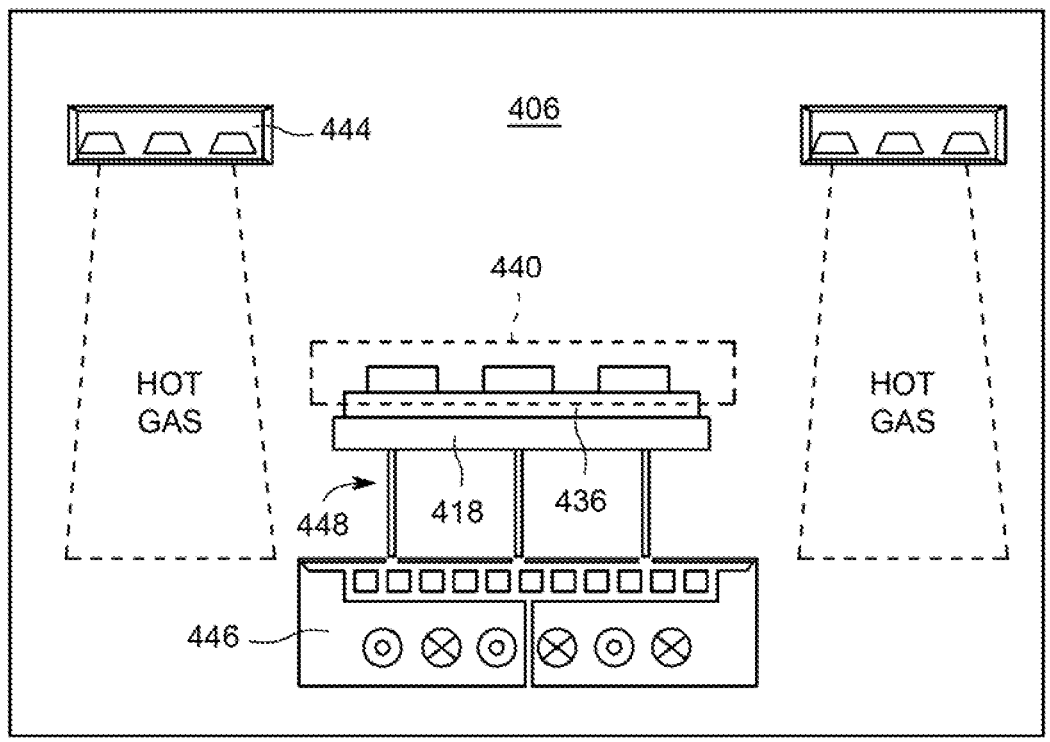
Figure 4C:
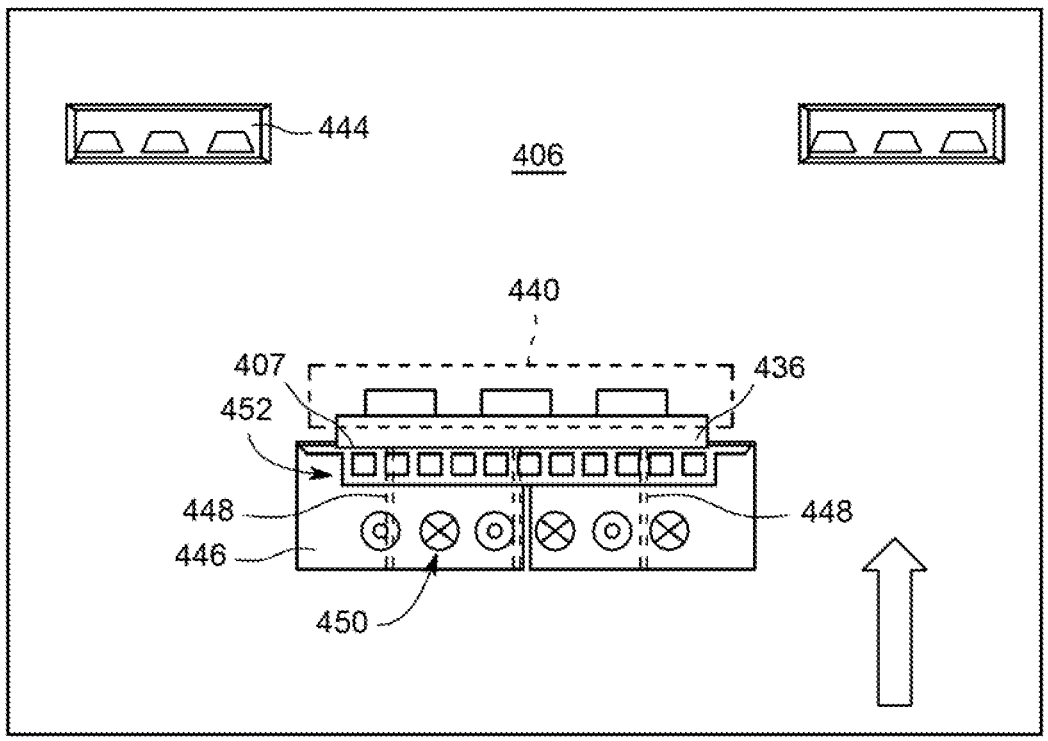
Figure 4D:
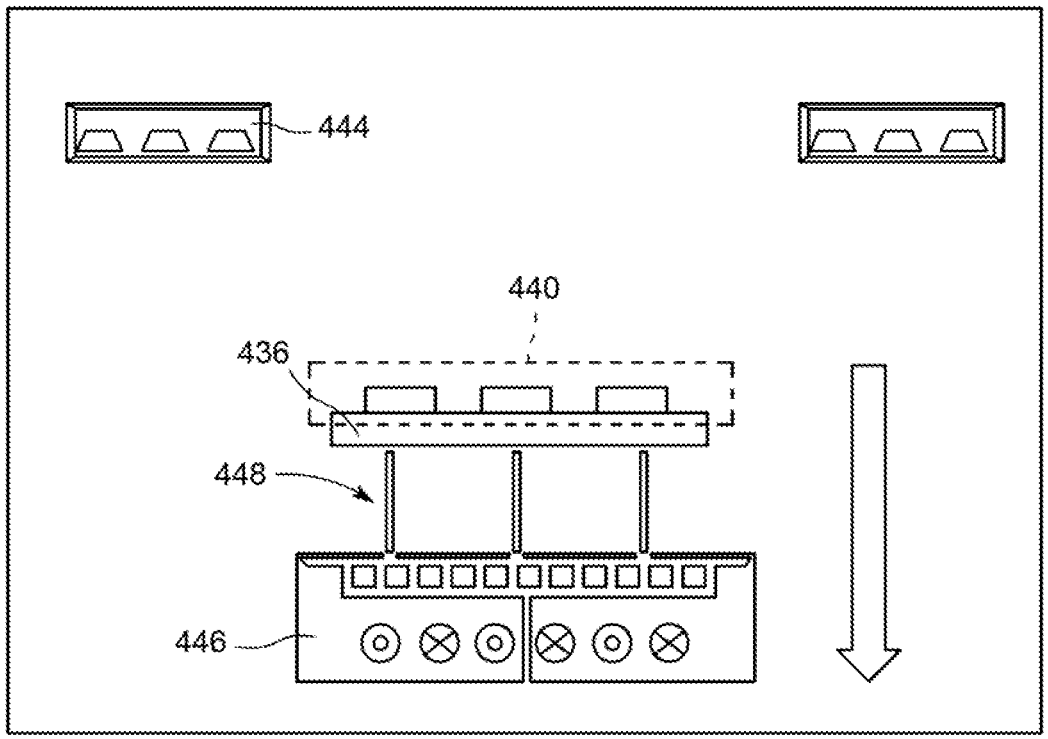

FIG. 3 is a flowchart of a method 300 for processing a substrate and FIG. 4 is sequence diagram illustrating a substrate being processed using the method 300 of FIG. 3. As noted above, substrates can sometimes become warped during one or more processes of substrate fabrication, e.g., due to excessive temperatures used to process the substrate. For example, epoxy mold that can be present on a substrate can sometimes cause a substrate to warp, e.g., become concave or convex along a top surface of the substrate, when the substrate is being heated to relatively high temperatures.

Accordingly, in at least some embodiments, a warped substrate 436, e.g., the substrate 136, which can have epoxy mold encapsulation 440 (shown in phantom) can be loaded into a process chamber, e.g., the process chamber 102, provided with a carrier 418, e.g., the carrier 118, configured to support the substrate 436 within a first processing volume 404, e.g., the first processing volume 104, of the process chamber. For example, in at least some embodiments, the substrate 436 can be loaded into the first processing volume 404 via an opening, e.g., the opening 122, using a robot, e.g., the robot 132, or other suitable device capable of transferring a substrate into the first processing volume 404 of the process chamber. The robot can transfer the substrate 436 through the opening and position the substrate 436 onto a substrate support surface of the carrier 418.

Next, at 302, in the first processing volume 404, the substrate 436, while supported on the carrier 418, can be heated to a first temperature (e.g., for thermal relaxation of the substrate 436) using, for example, one or more heating devices disposed with the first processing volume 404. For example, in at least some embodiments, the substrate 436 can be heated to the first temperature using a first heating device 408, which can be used as the first heating device 108. The first heating device 408 can include a heater 410 and a gas delivery device 412, which can be used as the heater 110 and the gas delivery device 112, respectively. The heater 410 and the gas delivery device 412 (e.g., using hot nitrogen gas or other gas suitable for heating a substrate) can heat the substrate 436 that is positioned on the carrier 418 to the first temperature. As noted above, in at least some embodiments, the first temperature can be, for example, the glass transition temperature $T_g$ of the substrate 436 (and/or an epoxy mold on the substrate 436, if provided) and/or to thermal equilibrium between the substrate 436 and the carrier 418. In at least some embodiments, one or more sensors 414, e.g., the temperature sensors 114, can be used to monitor a temperature of the substrate 436 and/or the carrier 418 to ensure that the temperature of the substrate 436 and/or the carrier 418 does not exceed a threshold, e.g., a particular temperature, the glass transition temperature $T_g$ of the substrate 436 (and/or an epoxy mold on the substrate 436, if provided), and/or thermal equilibrium between the substrate 436 and the carrier 418. While the substrate 436 and/or the carrier 418 is/are being heated to the first temperature, the substrate 436 is able to freely expand to an unwarped or flat configuration (or substantially flat configuration).

Next, at 304 the carrier 418 including the substrate 436 can be transferred from the first processing volume 404 to a second processing volume 406 (e.g., the second processing volume 106) of the process chamber. For example, in at least some embodiments, the robot in the first processing volume 404 can be used to transfer the carrier 418 including the substrate 436 from the first processing volume 404 to the second processing volume 406 via a pathway, e,g,, the pathway 134, that provides ingress and egress between the first processing volume 404 and the second processing volume 406. A second robot, e.g., the robot 132, in the second processing volume 406 is configured to receive the carrier 418 including the substrate 436 from the robot of the first processing volume 404 and position the carrier 418 including the substrate 436 above a chuck 446, e.g., the chuck 146.

The method 300 can include transferring the substrate 436 from the first processing volume 404 to the second processing volume 406 without using the carrier 418. For example, in at least some embodiments, the first robot can transfer the substrate from the carrier through the pathway and to the second robot, which can position substrate 436 directly above the chuck 446.

During transfer of the carrier 418 including the substrate 436, at 306, one or more hot gases can be provided into the second processing volume 406 via a gas delivery device 444, e.g., the gas delivery device 144, to maintain the substrate 436 and/or the carrier 418 at or near the first temperature.

Next, at 308, with the chuck 446 in the first position, e.g., in the lowered configuration, pins 448, e.g., the pins 148, are exposed to receive the substrate 436 from the carrier 418, For example, the robot can, position the carrier 418 over the chuck 446 by aligning exposed slots on the carrier 418, e.g., the exposed slots 206a, with the corresponding pins 448 of the chuck 446, and the substrate 436 can be transferred to the chuck 446.

Next, at 310, the substrate 436 can be cooled while providing a chucking force at an outer zone of the chuck 446 that is different than a chucking force provided at an inner zone of the chuck 446. For example, with the carrier 418 no longer positioned above the chuck 446 the chuck 446 can be moved to the second position, e.g., the raised configuration, to position onto a substrate support surface 407, e.g., the substrate support surface 206b, of the chuck 446. With the chuck 446 in the second position, the pins 448 (shown in phantom) will be covered by the chuck 446 and the warped portion of the substrate 436 will be positioned along the outer zone 2 and inner zone 1. Once the substrate is positioned along the outer zone 2 and inner zone 1, a vacuum source, e.g., the vacuum source 130, can be used to provide pressure (e.g., suction or chucking force) via a plurality of conduits or channels 452, e.g., the plurality of conduits or channels 152, to pull the warped portion of the substrate 436 toward the substrate support surface 407 of the chuck 446 to unwarp the substrate 436, e.g., to flatten or straighten (or substantially straighten) the substrate 436. Additionally, as suction is being provided to the substrate support surface 407 of the chuck 446, cooling fluid can be provided to internal cooling channels 450, e.g., internal cooling channels 150, of the chuck 446 to rapidly cool the substrate 436 to ensure that the substrate 436 remains fixed in the unwarped configuration.

After the substrate 436 is processed, chuck 446 can be moved back to the first position (e.g., the lowered configuration), and the robot can transfer the substrate 436 either back to the first processing volume 404 or out of the process chamber.

While the foregoing is directed to embodiments of the present disclosure, other and further embodiments of the disclosure may be devised without departing from the basic scope thereof.

The invention claimed is:

1. A system for processing a substrate, comprising:
 a process chamber comprising a first processing volume and a second processing volume;
 a first heating device disposed within the first processing volume and configured to heat the substrate to a first temperature;
 a carrier configured to support the substrate while the substrate is being heated using the first heating device to the first temperature and transferable with the substrate to and from each of the first processing volume and the second processing volume by a first robot in the first processing volume;
 a second heating device disposed within the second processing volume and configured to maintain the substrate at the first temperature while the substrate is being transferred from the first processing volume to the second processing volume by the first robot in the first processing volume through a pathway between the first processing volume to the second processing volume; and
 a chuck disposed within the second processing volume and configured to receive the substrate from the carrier by a second robot in the second processing volume at a first positon of the chuck, wherein the chuck comprises an outer zone and an inner zone having independent variable pressure control such that while the substrate is being cooled from the first temperature to a second temperature lower than the first temperature on the chuck at a second positon of the chuck lower than the first position, the chuck is configured to apply a chucking force at the outer zone that is different from a chucking force provided at the inner zone, wherein the chuck moves back to its first position after the substrate is being cooled to the second temperature and the second robot transfers the substrate back to the first processing volume or out of the process chamber.

2. The system of claim 1, wherein the first heating device comprises at least one infrared heating lamp and a gas delivery showerhead configured to provide at least one gas into the first processing volume of the process chamber.

3. The system of claim 1, wherein the second heating device comprises a gas delivery ring disposed above the chuck and extending radially outward therefrom.

4. The system of claim 1, wherein the chuck comprises a plurality of internal cooling channels configured for receiving a cooling fluid.

5. The system of claim 1, wherein the chuck is movable from a first position for receiving the substrate from the carrier to a second position for cooling the substrate.

6. The system of claim 1, further comprising at least one temperature sensor connected to a controller of the process chamber for monitoring a temperature of the substrate.

7. The system of claim 6, wherein the at least one temperature sensor is an infrared temperature sensor.

8. The system of claim 1, wherein the carrier has a generally circular configuration and comprises a plurality of exposed slots extending parallel relative to each other.

9. The system of claim 8, wherein the chuck comprises a plurality of pins that correspond to the plurality of exposed slots of the carrier, such that with the chuck in a first position a corresponding pin of the plurality of pins aligns with a corresponding exposed region of the plurality of exposed slots to allow the carrier to move above the chuck for positioning the substrate on the plurality of pins.

10. A nontransitory computer readable storage medium having stored thereon instructions that when executed by a processor configure the processor to perform a method for processing a substrate, comprising:
 heating the substrate to a first temperature while supported on a carrier disposed within a first processing volume of a process chamber using a first heating device disposed within the first processing volume;
 transferring the carrier with the substrate from the first processing volume to a second processing volume of the process chamber by a first robot in the first processing volume;
 maintaining the substrate at the first temperature using a second heating device disposed within the second processing volume while the substrate is being transferred from the first processing volume to the second processing volume by the first robot in the first processing volume through a pathway between the first processing volume to the second processing volume;
 transferring the substrate to a chuck located in the second processing volume by a second robot in the second processing volume at a first positon of the chuck; and
 cooling the substrate from the first temperature to a second temperature lower than the first temperature on the chuck at a second positon of the chuck lower than the first position while providing a chucking force at an outer zone of the chuck that is different than a chucking force provided at an inner zone of the chuck;
 moving the chuck back to its first position after the substrate is being cooled to the second temperature and transferring the substrate back to the first processing volume or out of the process chamber by the second robot.

11. The nontransitory computer readable storage medium of claim 10, wherein heating the substrate to the first temperature using the first heating device comprises using at least one infrared heating lamp and a gas delivery showerhead configured to provide at least one gas into the first processing volume of the process chamber.

12. The system of claim 1, wherein the carrier includes an outer flange that is configured to maintain the substrate in a fixed configuration while the substrate is being processed.

13. The system of claim 1, wherein the carrier includes a thermal surface area contact for the substrate that allows the substrate to fully expand while the substrate is being heated to the first temperature.

14. The system of claim 1, wherein the carrier is configured to be heated to thermal equilibrium with the substrate in the first processing volume such that thermal equilibrium is maintained when the carrier with the substrate is transferred from the first processing volume to the second processing volume.

15. The system of claim 1, wherein the first temperature is about 150° C. to about 200° C.

16. The nontransitory computer readable storage medium of claim 10, wherein heating the substrate to the first temperature comprises heating the substrate to about 150° C. to about 200° C.

\* \* \* \* \*